United States Patent [19]

Lingle et al.

[11] Patent Number: 5,242,560
[45] Date of Patent: Sep. 7, 1993

[54] HEAT TREATABLE SPUTTER-COATED GLASS

[75] Inventors: Philip J. Lingle, Lambertville; Raymond Nalepka, Westland, both of Mich.

[73] Assignee: Guardian Industries Corp., Northville, Mich.

[21] Appl. No.: 736,581

[22] Filed: Jul. 26, 1991

Related U.S. Application Data

[60] Continuation of Ser. No. 537,133, Jun. 13, 1990, abandoned, which is a division of Ser. No. 418,959, Oct. 10, 1989, Pat. No. 5,048,799, which is a continuation-in-part of Ser. No. 321,060, Mar. 9, 1989, abandoned.

[51] Int. Cl.$^5$ .............................................. C23C 14/34
[52] U.S. Cl. ..................... 204/192.27; 204/192.26; 427/163
[58] Field of Search ............. 204/192.26, 192.27, 204/192.28, 192.15; 427/163

[56] References Cited

U.S. PATENT DOCUMENTS

| | | | |
|---|---|---|---|
| 3,682,528 | 8/1972 | Apfel et al. | 359/359 |
| 3,826,728 | 7/1974 | Chambers et al. | 204/192 |
| 3,935,351 | 1/1976 | Franz | 428/34 |
| 4,022,947 | 5/1977 | Grubb et al. | 428/432 |
| 4,122,239 | 10/1978 | Riboulet et al. | 428/621 |
| 4,327,967 | 5/1982 | Groth | 359/359 |
| 4,413,877 | 11/1983 | Suzuki et al. | 350/1.7 |
| 4,414,254 | 11/1983 | Iwata et al. | 428/433 |
| 4,421,622 | 12/1983 | Hollars | 204/192 |
| 4,462,883 | 7/1984 | Hart | 204/192 C |
| 4,537,798 | 8/1985 | Cohen | 427/166 |
| 4,563,400 | 1/1986 | Giss et al. | 428/630 |
| 4,594,137 | 6/1986 | Yillery et al. | 428/432 |
| 4,715,879 | 12/1987 | Schmitte et al. | 65/60.2 |
| 4,786,783 | 11/1988 | Woodward | 219/547 |
| 4,799,745 | 1/1989 | Meyer et al. | 350/1.7 |
| 4,826,525 | 5/1989 | Chesworth et al. | 65/60.2 |
| 4,973,511 | 11/1990 | Farmer et al. | 428/216 |

*Primary Examiner*—Nam Nguyen
*Attorney, Agent, or Firm*—Myers, Liniak & Berenato

[57] ABSTRACT

A heat treatable sputter-coated glass having on its glass substrate a coating system consisting essentially of a high nickel alloy overcoated with tin oxide and, optionally, undercoated with tin oxide with, or without, a layer of metallic aluminum located between the high nickel alloy layer and the overcoat of tin oxide.

8 Claims, 1 Drawing Sheet

HEAT TREATABLE SPUTTER-COATED GLASS

RELATED APPLICATION

This is a continuation, of application Ser. No. 537,133 filed Jun. 13, 1990 abandoned which is a division of application Ser. No. 418,959 filed Oct. 10, 1989 U.S. Pat. No. 5,048,799 which is a continuation-in-part of application Ser. No. 321,060 filed Mar. 9, 1989 abandoned.

BACKGROUND OF THE INVENTION

This invention relates to glasses provided with specific coatings which may thereafter be heat treated at temperatures sufficiently elevated to bend, heat-strengthen, and/or temper the glass. The invention finds particular utility in architectural and automotive glass production.

The popularity of metal or metal-oxide coated glasses in architectural an automotive design is well known. As reported prolifically in patent and other literature, such glasses thru the manipulation of the coating's layering system, usually by choice of metals and/or metal oxides and/or thicknesses, can usually achieve, quite acceptably, the degree of reflectance, transmittance, emissivity and durability, as well as the color, desired. See, for example, U.S. Pat. Nos. 3,935,351; 4,413,877; 4,462,883; 3,826,728; 3,681,042; 3,798,146; and 4,594,137 just to name a few.

It has also been well reported that while several reasonably acceptable techniques exist for applying such coatings, one of the most efficacious, and thus preferred, is the well known technique referred to as "magnetically enhanced sputter-coating". Such a technique is reported in U.S. Pat. No. 4,166,018, a recognized fundamental teaching on the subject. (See also, Munz et al. "Performance and Sputtering Criteria of Modern Architectural Glass Coatings" SPIE Vol. 325 *Optical Thin Films*, 1982, pg. 65-73.) While efficacious, for many known layer systems its use may result in mechanical durability being less than that achieved by another known method called the "pyrolytic" technique. As a reverse function, however, sputter-coated systems often achieve better infrared reflectance than typical pyrolytic coatings.

Because of the popularity of these coated glasses, numerous companies have entered the marketplace in recent years. Some of these glasses are sputter-coated. Others are coated by other techniques such as the pyrolytic process. Some are bent, others are flat. While the precise compositions of many of these coated glasses is not known, what is known is that none of them achieve the same characteristics of this invention, nor do they appear to employ the same unique combination of elements that achieve these characteristics, and thus make up the subject invention.

For example, one system that is generally known is the Leybold "Spectrum" windshield glass system known as TCC-2000. In this system four or five layers of metals and metal oxides are employed to obtain a sputter-coated glass which, being somewhat heat treatable at temperatures up to 1100° F., may be used as a pre-coated glass for making bent or unbent, glass windshields, provided rather rapid time limits are placed on the heat treatment. The layering from glass substrate outwardly usually includes a first layer of tin oxide, a second layer of a nickel/chromium alloy (usually about 80/20), a third layer of silver, a fourth layer of the nickel/chromium alloy, and a fifth layer of tin oxide. In addition to the rather low upper limit on heat treatment temperatures and times, the resultant coatings are rather soft and exhibit such unacceptably low chemical resistance characteristics that they can realistically be used only on the inner surfaces of laminated glass windshields. Leybold's other systems, such as its "Solar coatings" (sputter-coated $SnO_2/Cr/SnO_2$); "Low-E" (sputter-coated $SnO_2/Ag/Al/SnO_2$); and "Revised Architectural" (sputter-coated $SnO_2/Ag/NiCr/SnO_2$, NiCr being 80/20) have not proven to be heat treatable.

Exemplifying further knowledge prior to the subject invention, are several systems (in the patents, as well as those marketed) which recognize that various oxides such as titanium dioxide, tin oxide, mixtures of tin oxide with other metal oxides (e.g. with ZnO) may be used as an efficacious overcoat or undercoat for durability and other properties. In addition, several recognize that aluminum, nickel and a wide variety of nickel-based alloys such as stainless steel (i.e. less than about 15% Ni), Inconel, etc., may be used as efficacious intermediate layers in sputter-coated glasses. Exemplary of these types of glasses include the following:

| Company | Trade Designation | Layer System (on Information and Belief) |
|---|---|---|
| PPG | Solarcool | single layer, heat treatable, non-sputter coated, $Cr_2O_3$ |
|  | Solarban | stainless steel bearing, not heat treatable, sputter-coated, various oxides, nitrides and metals sputter-coated, not known to be heat treatable $(SnZn)O_2$—Ag—Ti—$(SnZn)O_2TiO$ |
| Ford | Sunglass Reflective | similar to PPG Solarcool single layer, unknown oxide |
|  | Sunglass Hp Reflective | similar to Solarban |
| SPI | Sunglass HP Reflective | similar to Solarban |
|  | Sunglass HR | sputter-coated, not known to be heat treatable, oxide-Ag-Metal-Oxide |
| LOF | Eclipse | pyrolitic, heat treatable not sputter-coated |
| AIRCO | Solar Coatings | numerous sputter coating of various oxides, nitrides and metals, including stainless steel (e.g. less than 15% Ni), none are heat treatable |
|  | Architectural L.E. and Sunbelt L.E. | sputter-coated, not known to be heat treatable Ti $ZnO_2$—Ag—ZN—$ZnO_2$—$TiO_2$ |
|  | Aircool 72 & 76 | sputter-coated, non-durable, not known to be heat treatable $ZnO/Ag/Zn/ZnO/Ag/Zn/-znO_x$ |
|  | Airco Super-H (Heat Treatable) experimental | $SnO_x/Al/Ag/Al/SnO_x$ sputter-coated, non-durable, heat treatable |
| LEYBOLD | Solar coatings | sputter-coated, not heat treatable $SnO_x$—CrN—$SnO_x$ |
|  | Low-E | sputter-coated, not known to be heat treatable $SnO_x$—Ag—Al—$SnO_x$ |
|  | Revised Architectural | sputter-coated, not known to be heat treatable |

-continued

| Company | Trade Designation | Layer System (on Information and Belief) |
|---|---|---|
| | TCC-2000 | $SnO_x$—Ag—NiCr—$SnO_x$ (Ni/Cr is 80/20) discussed above. Heat treatable but not durable (Ni/Cr is 80/20) |
| GLAVERBEL | StopSol | $SnO_x$—NiCr—Ag—NiCr—$SnO_x$ single layer of unknown metallic oxides, heat treatable pyrolytic coating |
| | Prestige | sputter coatings of oxide-Ag-oxide, oxides unknown, not heat treatable or durable |
| | Comfort | single layer of unknown metal oxide, heat treatable pyrolytic system |
| PILKINGTON | Reflecta Float | single layer of metallic Oxide (possibly Cr or Ni containing) heat treatable pyrolytic, not sputter-coated |
| | Sputtered coatings | various layers of oxides, Nitrides and metal, metal can be Ni bearing of 15% or less Ni, not heat treatable |
| ASAHI | (experimental) Sunroof coating | heat treatable, total constituents unknown, may have some Ni, most probably Ti and Al |
| GUARDIAN (Luxguard) | "S", "T", "C" series | various sputter-coated, |
| | RP-20, Nu-52, LE-75, | non-heat treatable |
| | Appln. S. N. 077,226 filed 7/24/87 and now U.S. Pat. No. 4,883,721 | layer systems of oxides and/or metals. Oxides include $SnO_x$, $ZnO_2$, $TiO_2$ and the like as protective coatings. Typical Metals are Cu, Ag, stainless steel (less than 15 Ni) and/or Ti. LE-75, for example, has included in the past in one embodiment an $SnO_x$—Cu—$SnO_x$ layer system which is not heat treatable. Modern LE-75 layers are more complex systems involving $TiO_2$, $ZnO_2$ and other non-nickel bearing metals. |
| FLACH-GLASS (also St. Gobain) | Sightchrom | $(INSnO_x)/Pt/(INSnO_x)$ heat treatable cost prohibitive scratches |
| | U.S. Pat. Nos. 3,901,997;4,497,700 and 3,978,273 | various layers with Ag, Au or Cu coating including 80/20 Ni/Cr |
| | Infrastop | sputter-coated, not heat treatable, various layers of oxides, nitrides and metals, some metals may contain 15% or less Ni |
| | U.S. Pat. No. 4,816,054 | metal silicide coating sputter-coated and said to be heat treatable |

In the above listing tin oxide is indicated as $SnO_X$. At times in the prior art it is stated as $SnO_2$. No distinction is drawn herein between these two forms of reference for tin oxide.

Of these glasses, perhaps three may be classified as coming closest to the subject invention; namely, TCC-2000, Airco Super-H experimental and Sightchrom. TCC-2000's lack of durability and its drawbacks are discussed above. Sightchrom employs an indium-tin oxide combination as its first and third of three coatings. As its intermediate metallic layer it employs platinum. It scratches easily and it is prohibitive cost-wise. Airco Super-H experimental, while heat treatable, employs silver, and has been found to lack durability.

None of these listed glasses achieves or recognizes the particularly unique results that are obtained when only tin oxide is used as an overcoat (and also optionally as an undercoat as well) alone or with aluminum, together with nickel or a specific type of nickel alloy in a sputter-coating process, as contemplated by this invention, to produce unique heat treatable glasses with excellent tolerance to temperatures above 1100° F. at times usually employed in non-coated glass heat treatments, and which in preferred embodiments are not only heat treatable, but durable (scratch resistant) as well. Such glasses, in fact, are so durable that there is no need to laminate them to protect the layer system from ordinary use.

U.S. Pat. No. 4,790,922 exemplifies the efficacy of the subject invention. This patent discusses the difficulties which the prior art has experienced in attempting to develop coated glasses for architectural and automotive purposes which must be, or are desirably, put through their heat treatment step (e.g. tempering, bending, or both) after the coating is applied. The solution posed in this prior art patent is a rather complex layer system consisting of a first layer of an Sn/Zn oxide, a second layer of titanium, a third layer of silver or stainless steel, a fourth layer of titanium, a fifth layer of an Sn/Zn oxide, and a sixth, top layer of titanium oxide. The patent, while stating the material is heat treatable, acknowledges in Col. 4, line 56-57, that: "The glass can then be heated to approximately 1100 degrees fahrenheit . . . " In addition to being a rather complex system, it relies upon titanium for three of its layers, and indeed its effectiveness. Titanium, experience shows, is a difficult (slow) element to sputter. By teaching the need to overcoat the Zn/Sn oxide fifth layer with $TiO_2$, there is a teaching away from the subject invention which unexpectedly has found that when tin oxide is used alone or with aluminum, together with certain select nickel compounds, it overcomes the problems in this patented system, and there is, among other advantages, no need for a $TiO_2$ overcoat.

There are three different types of heat treatments that are generally employed to work glass for architectural or automotive purposes; namely, bending, tempering, and a lesser form of tempering called "heat strengthening". When bending without tempering conventional ¼" clear float glass, for example, times of 10-30 minutes at 1150° F. or more are generally necessary to use. In heat strengthening or tempering such glass, with or without bending, temperatures as high as 1450° F. (e.g. 1150°-1450° F.) are normally employed for about 2-5 minutes. As can be seen, there are significant drawbacks to the known or reported prior art techniques for providing heat treatable coated glass, particularly of the efficacious sputter-coated type.

Coated glasses for use in architectural or automotive design generally have eight (8) characteristics which determine their efficacy and/or marketability: commercial feasibility, durability (mechanical resistance to abrasion), chemical resistance, long-term stability, emissivity, transmittance, reflectivity and color. In prior systems, some of the characteristics had to be significantly impaired in order to achieve the necessary degree of acceptability for the remaining characteristics. For this and other reasons, therefore, it is apparent that there exists a need in the art for a heat treatable, coated glass useful in architectural and/or automotive design which does not unduly sacrifice the above eight (8) characteristics, and preferably, which also may be heat treated (i.e. bent, tempered, and/or heat-strengthened) at the upper temperature ranges and times of such treatments. There is also a need for such a coating to be formed by sputter-coating techniques, but which does not sacrifice mechanical durability as compared to pyrolytically formed coatings.

It is a purpose of this invention to fulfill the above-described needs, as well as other needs apparent to the skilled artisan from the following detailed description of this invention.

SUMMARY OF THE INVENTION

Generally speaking, this invention fulfills the above described needs in the art by providing a heat treatable article comprising a glass substrate having thereon a coating system consisting essentially of a metallic layer selected from nickel or a high nickel content alloy and as an overcoat therefor a layer of tin oxide.

In an alternative form of the invention there is further provided a layer of tin oxide as an undercoat layer for said metallic layer. In still another form, particularly preferred especially for automotive bent windshields, metallic aluminum overlays the nickel or Ni alloy layer and underlies the outer $SnO_2$ layer. In certain preferred forms of this invention no other layers or ingredients are provided, other than those described above with respect to the 2, 3, or 4-layered system.

Because the elements used in carrying out this invention, in their preferred forms, are all readily sputterable by known, conventional magnetically enhanced sputter-coating processes, this invention further fulfills the above-described needs in the art by providing a unique method for forming a heat treatable article comprising the steps of sputter-coating upon a glass substrate a coating system consisting essentially of a metallic layer selected from nickel or a high nickel content alloy and as an overcoat therefor a layer of tin oxide. As stated above, another layer of $SnO_2$ may be sputter-coated as a first, glass contacting layer. As further stated above, in particularly preferred embodiments, the method of this invention contemplates sputter-coating four layers which from glass outwardly are: $SnO_2$/Ni or Ni alloy/ Al/$SnO_2$.

This invention will now be described with reference to certain preferred embodiments thereof along with illustrations found in the accompanying drawings wherein:

DESCRIPTION OF THE PREFERRED EMBODIMENT

Figure 1:
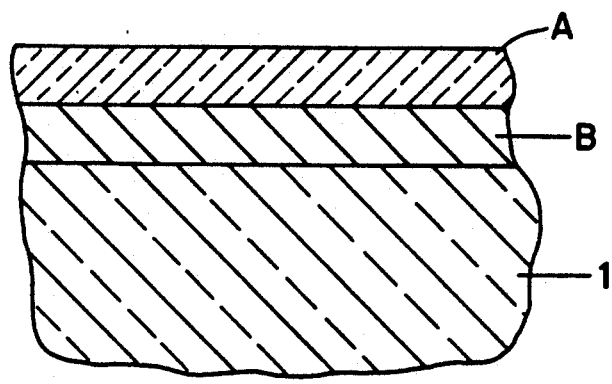
FIG. 1 is a partial side-sectional view of a two-layer coating system according to certain embodiments of this invention.
Figure 2:
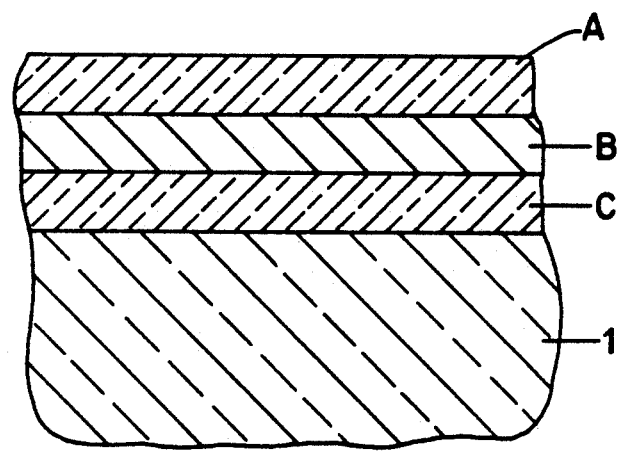
FIG. 2 is a partial side-sectional view of a three-layer coating system according to certain embodiments of this invention.
Figure 3:
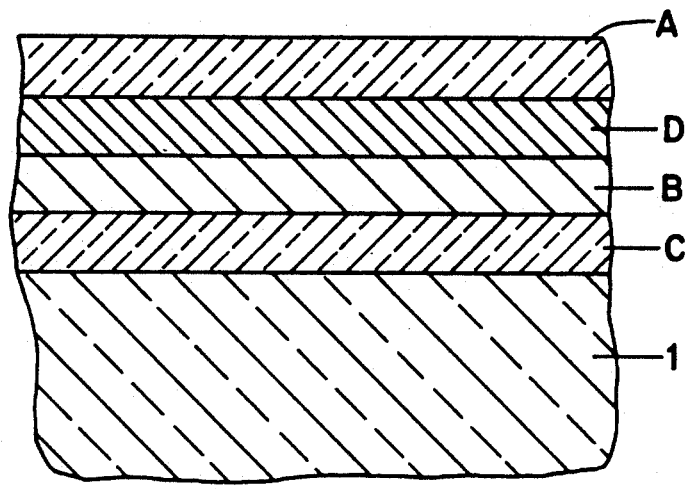
FIG. 3 is a partial side-sectional view of a four-layer coating system according to certain embodiments of this invention.

Reference to the accompanying drawings FIGS. 1-3, shows that the preferred coatings of this invention consist essentially of 2, 3, or 4 layers sputter-coated onto glass. In the two-layer system (FIG. 1) a glass substrate 1 has sputter-coated upon it an adhering metallic layer B consisting essentially of nickel or a high nickel content alloy (i.e. at least about 50% Ni). Thereafter, overcoat layer A consisting essentially of tin oxide (SnOx) is sputter-coated thereover. The three-layered system (FIG. 2) is the same, except that an initial layer C consists essentially of the same tin oxide used as the overcoat layer A in FIG. 1 with the nickel or high nickel content alloy sandwiched as layer B between the two tin oxide layers A and C. The four-layered system (FIG. 3) is the same, except that overlaying metallic layer B is another sputter-coated layer of metallic aluminum. It has been found that tin oxide, when sputter-coated from a tin cathode as layer C in an oxygen-containing environment according to conventional sputter-coating techniques, forms an excellent, durable bond with both glass substrate 1 and the Ni-containing metallic layer as contemplated by this invention. It has also been found that when sputter-coated as an overcoating (with or without $SnO_x$ as an undercoat) this same oxide, when used with the specified metallic layer B, renders the system heat treatable and durable. It has further been found, quite unexpectedly, that if metallic aluminum is sputter-coated as layer D, the heat treatableness and durability are further enhanced significantly.

The glasses useful in this invention may be of a wide variety, and may be tinted or untinted. Efficacious are untinted or gray tinted glass sheets made by the well known float process, and referred to as float glass. such glasses may be bent or used flat, and may be heat strengthened, or tempered, with, or without bending to form a wide variety of structures from decorative, colored low emissivity, transparent, window panes for buildings, to "privacy" windshields in cars. In this respect, in the preferred embodiments the final structure is highly durable, particularly when layer D is employed, such that the glass, without lamination, is useful as an automotive window.

The coating technique useful and preferred is the well known in-line magnetically enhanced sputter-coating process and equipment available from Airco-Temescal, the basic technique of which is disclosed in the aforesaid U.S. Pat. No. 4,166,018.

While the invention herein is not necessarily limited to 2, 3, or 4 layers, any layer added must not interfere adversely with the heat treatable characteristic of the coated glass formed. Thus the term "consisting essentially of" as used to describe the coating systems of this invention is intended to exclude any layer which, if used, would deteriorate adversely the heat treatable nature of the products of this invention. For example, it has been found, as evidenced by the "Spectrum" coatings referred to above, that if silver is used as a layer, heat treatability is severely deteriorated, unless the most preferred nickel alloys of this invention (e.g. ones containing Ni, Fe, Cr, C, Al, and Y) are used.

The term "consisting essentially of" when used to describe the tin oxide undercoat and/or overcoat layers of this invention, and to described the metallic aluminum layer, is used in a similar way. Tin oxide ($SnO_x$) is not alloyed or mixed in the preferred embodiments of this invention. Neither is the aluminum. Excepted from this, of course, are minor "impurities" that may inherently occur in the tin or aluminum of the cathode employed. However, if other metals or oxides are employed, it is a requirement that any such other metals or oxides added do not deteriorate adversely from the heat treatable nature of the products of this invention. For example, the use of antimony (Sb) with the tin was found to be unsatisfactory since it resulted in 15-20 unit changes in reflectance/transmittance characteristics during heat treating. ZnO itself was found to be unsuitable, as another example. Thus, while it is possible that small amounts of some other metals may be tolerated in the tin oxide; the undercoat, and particularly the overcoat, should generally only include tin oxide by itself. The same holds true for the metallic aluminum layer when employed.

A wide variety of sputterable nickel alloys, and nickel itself, have been reported or used in the past as coatings on glasses. The subject invention achieves its unique characteristics, however, by using only a particular type of nickel alloy, referred to herein as nickel or a "high nickel content alloy". Again, the term "consisting essentially of" is used to define this layer in the same way it defined the tin oxide and aluminum layers referred to above. Generally speaking, the high nickel content alloy should be a Ni-Cr-Fe alloy having a nickel content of at least about 50%, and preferably at least about 70%. "Pure" nickel may be used, but it is difficult to sputter in production. Thus it is preferable to use an alloy, and in this respect preferably one having no more than about 90% Ni. It has been found that nickel alloys having less than about 50% Ni, e.g. 316-stainless steel (8% Ni) are simply unacceptable and do not achieve the desired characteristics of this invention. Examples of high nickel content alloys contemplated for use in this invention include Inconel 600, Inconel 601, 50—50 nickel chrome and 80-20 nickel chrome.

A particularly preferred alloy for use in practicing this invention is a high content nickel alloy consisting essentially of Ni, Cr, Fe, C, Al and Y (i.e. yttrium). In this respect, it has been found that a preferred six-member alloy of this type includes by weight %: about 76% Ni, about 4% Fe, about 16% Cr, less than about 0.5% C., about 5% Al, and less than about 0.1% Y. Particularly good results, in fact, are achieved with such an alloy, available in commercial form as Haynes ® Alloy No. 214. The composition of such an alloy is:

| Element | Approx. ("about") % by wt. |
|---|---|
| Ni | 75.45 |
| Fe | 4.00 |
| Cr | 16.00 |
| C | .04 |
| Al | 4.50 |
| Y | .01 |

The coatings of this invention are heat treatable. In the preferred forms, emissivity, transmittance, and reflectivity (the latter two viewed from both sides of the glass) vary by about 10 units or less during the heat treatment, preferably less than about 8 units, and in some instances less than about 1 unit, while maintaining excellent durability, chemical resistance, and long-term stability. This is true despite the fact that conventional times and temperatures (above 1100° F., e.g. 1150° F.-1450° F.) are used during the heat treatment (e.g. bending, tempering or heat strengthening, or the latter two with bending). Indeed, it is a unique feature of this invention that in many embodiments it will be found that these characteristics actually improve with heat treating, and that the color is actually advantageously improved (i.e. becomes more neutral) with heat treatment. For example, in certain preferred embodiments using Haynes ® Alloy No. 214 and one or two unalloyed tin oxide layers, color by the $(Y, \bar{x}, \bar{y})$ system goes from 28.00, 0.3250, 0.3250 respectively to 21.00, 0.3150, 0.3150 respectively.

A typical two-layered system according to FIG. 1 would be a float glass sheet as substrate 1 having a thickness of about 3/32"-⅛", a high nickel content Ni, Cr, Fe alloy of about 50 Å–250 Å (preferably about 150 Å) as layer B, and a tin oxide overcoat layer of 20 Å–500 Å (and preferably about 160 Å) as layer A. The three-layer system of FIG. 2 is the same, except a very thin (e.g. a "flash" coating of a few Angstroms) to 500 Å (preferably about 160 Å) layer of tin oxide is used as layer C. The four-layered system of FIG. 3 is the same except a metallic layer of aluminum of about 5 Å–500 Å (preferably about 60 Å) is used as layer D. ("5 Å" is meant to indicate a very thin layer of Al.)

While the precise mechanism by which the unique characteristics of this invention are achieved is not fully understood, it is believed that the various layers serve at least the following purposes, and thus may be varied in thickness by the routineer in the art once given this disclosure, to fine tune his particular system to the particular characteristics desired.

| Layer A: | a) Reduces oxidation of metallic layer 'B' during heat treatment |
|---|---|
| | b) Reduces abrasion of metallic layer 'B' prior to heat treatment |
| | c) Increases chemical resistance of layer system |
| | d) Adjusts optical characteristics of layer system, (transmission, reflectance, reflected color) |
| Layer B: | a) Reflects infrared radiation |
| | b) Reflects visible light |
| | c) Reduces solar energy transmission |
| | d) Reduces visible light transmission |
| | e) Resists high temperature oxidation during heat treatment |
| Layer C: (optional) | a) Reduces visible light reflectance (anti-reflective layer) |
| | b) Reduces layer B to glass interaction at high temperature |
| | c) Increases chemical resistance of layer system |
| | d) Adjusts optical characteristics of layer system, (transmission, reflectance, reflected color) |
| Layer D: (optional) | a) retards oxidation of layer B during heat treatment |
| | b) enhances durability (i.e. scratch or abrasion resistance) |

As stated above, the preferred process to be used in manufacturing the coated glass structures of this invention is sputter-coating. Typical processing parameters for an Airco-Temescal, 3-zone, 9 cathode position architectural coater are:

| Layer A: | Working Gases: | Argon and Oxygen (ratios variable up to 100% $O_2$) |
|---|---|---|
| | Gas Pressure: | 0.5 to 5.0 × $10^{-3}$ Torr |
| | Target Voltage: | Varies (Approx. 200–800 volts) |

|          | -continued |  |
|----------|------------|------------|
| Layer B: | Target Amperage: | Varies |
|          | Working Gas: | Argon (100%) |
|          | Gas Pressure: | 0.5 to 5.0 × $10^{-3}$ Torr |
|          | Target Voltage: | Varies (Approx. 200–800 volts) |
|          | Target Amperage: | Varies |
| Layer C: (optional) | Working Gases: | Argon and Oxygen |
|          | Gas Pressure: | (ratios variable up to 100% $O_2$) |
|          | Target Voltage: | Varies (Approx. 200–800 volts) |
|          | Target Amperage: | Varies |
| Layer D: (optional) | Working Gases: | Argon (100%) |
|          | Gas Pressure: | 0.5 to 5.0 × $10^{-3}$ Torr |
|          | Target Voltage: | Varies (Approx. 200–800 volts) |
|          | Target Amperage: | Varies |

When ¼" clear float glass is coated in accordance with the above process and heated to 1200° F. for 15 minutes, the resulting properties of the coated glass produced are typically:

FIG. 1
2-LAYER COATING

| | |
|---|---|
| Visible Transmission: | 0–50% Illuminate 'C' |
| Visible Reflectance: | 10–65% Coated Side, Ill. 'C' |
|  | 5–60% Glass Side, Ill. 'C' |
| Visible Color: | Pewter to Bronze (film side) |
| Visible Color: | Silver to Bronze (glass side) |
| Emissivity: | 0.10–0.60 (varies with metal thickness) |
| Sheet Resistance: | 10–200 OHMS per square (varies with metal thickness) |

FIG. 2
3-LAYER COATING

| | |
|---|---|
| Visible Transmission: | 0–60% Illuminate 'C' |
| Visible Reflectance: | 10–60% Coated Side, Ill. 'C' |
|  | 5–55% Glass Side, Ill. 'C' |
| Visible Color: | Silver to Bronze (film side) |
| Visible Color: | Pewter to Blue (glass side) |
| Emissivity: | 0.10–0.60 (varies with metal thickness) |
| Sheet Resistance: | 10–200 OHMS per square (varies with metal thickness) |

FIG. 3
4-LAYER COATING

| | |
|---|---|
| Visible Transmission: | 0–75% Illuminate 'C' |
| Visible Reflectance: | 5–65% Coated Side, Ill. 'C' |
|  | 5–65% Glass Side, Ill. 'C' |
| Visible Color: | Silver to Bronze (film side) |
| Visible Color: | Pewter to Blue (glass side) |
| Emissivity: | 0.10–0.70 (varies with metal thickness) |
| Sheet Resistance: | 10–500 OHMS per square (varies with metal thickness) |

In addition to the above, many of the glasses contemplated herein exhibit excellent U-V resistance. Furthermore, there is no requirement that the glass substrate be float glass, or even clear glass. The invention is applicable to a wide variety of glasses (or even glass ceramics) which may, if desired, be tinted; e.g. gray, green or the like.

This invention will now be described with reference to certain examples, as follows:

EXAMPLE 1

A multilayer thin film coating is deposited on a substrate of soda lime silica float glass which is capable of withstanding process temperatures as high as 1450° F. (788° C.) for approximately 5 minutes.

In this example a 3 (0.9 m) by 4 feet (1.22 m), 3/16 inch (4.8 mm) gray tinted glass substrate with a visible daylight transmittance of 49% as measured at a wave length of 550 nanometers, is coated with a three-layer thin film coating by the magnetron sputtering method as developed by Airco-Temescal. The coating layers are applied in succession using a three-zone architectural coater available from Airco-Temescal. Prior to coating, the glass is washed by two conventional flat glass washers positioned in series to the architectural coater.

The first coating zone is equipped with two tin cathodes (99.9% tin) which run the width of the coater. The tin cathodes are installed in positions 1 and 2 with position 3 being reserved for a cathode material which would enable applying other types of coatings. The nominal base pressure of $5.0 \times 10^{-6}$ Torr for Zone 1 is increased to a sputtering pressure of $2.0 \times 10^{-3}$ Torr by bleeding in 700 Sccm of a pre-mixed 80% oxygen and 20% argon gas. The sputtering pressure is further sublimated with a pure argon flow of 176 Sccm. Both cathodes are powered by 120 kw DC power supplies set for 369 volts and 35 amps. The glass is conveyed through the coater at a line speed of 54.0 inches/minute. A visible light transmission monitor positioned at the end of Zone 1 recorded a reading of 48.5% transmission. The resultant coating layer at this point is an anti-reflective coating of $SNO_X$. The glass side reflectance of the three-layer thin film coating can be decreased by increasing the thickness of the 1st layer of $SNO_X$. The primary function of this layer is the control of reflectance and color. Its contribution to the heat resistance of the total layer system is not substantial.

The second coating zone is equipped with one cathode of Haynes ® Alloy No. 214 in position 5. Positions 4 and 6 are reserved for cathode materials which would enable applying other types of coatings. At the line speed mentioned above, the gray glass passes under the Haynes ® Alloy No. 214 and a visible light transmission of 7.5% is recorded at the end of Zone 2. The "214" cathode is powered by a 120 kw DC power supply set for 476 volts and 19.0 amps. The "214" cathode is sputtered in an atmosphere which the nominal base pressure of $5.0 \times 10^{-6}$ Torr for Zone 2 is increased to a sputtering pressure of $2.0 \times 10^{-3}$ by bleeding in 640 Sccm of argon gas. The primary function of the "214" layer is to control transmission, provide thermal performance and resist oxidation at the process temperatures mentioned above.

The third coating zone is equipped with one cathode of tin in position 7. Positions 8 and 9 are reserved for cathode materials which would enable applying other types of coatings. Continuing at the pre-set line speed of 54 inches/minute, a second layer of $SnO_x$ is sputtered over the existing 2-layer coating. As in Zone 1, a 120 kw DC power supply is used to power the tin cathode. The power supply is set for 434 volts and 50.0 amps. The nominal base pressure of $5.0 \times 10^{-6}$ Torr for Zone 3 is increased to a sputtering pressure of $2.0 \times 10^{-3}$ Torr by bleeding in 620 Sccm of a pre-mixed 80% oxygen and 20% argon gas. The sputtering pressure is further sublimated with a pure argon flow of 154 Sccm. The three-layer coating passes under a visible light transmission monitor at the end of Zone 3 and a reading of 10.7% is recorded. The primary function of the third layer system is to protect the "214" layer from corrosion at the process temperatures mentioned above, in addition to enhancing color and improving mechanical durability of the completed layer system. The coated glass is inspected for coating defects and the optical properties are evaluated using a colorimeter as manufactured by Spectrogard. In this example, a glass side visible reflectance of 11.0% and glass side chromaticity color coordinates of $\bar{x}=0.3120$, $\bar{y}=0.3145$ are recorded.

At this point the three-layer coating on gray tinted glass is ready for further processing into an automotive side lite (privacy window). Except for slight modifications to the tempering process, which would be common knowledge to someone versed in tempering, the glass may be cut, ground, silk screened, heated, bent and tempered by processes normal to the manufacture of automotive side lites. For example, the above-coated glass is first cut to required size and edged to customer's requirement, including the application of a ceramic frit border if required. The structure is then heated at a moderate rate to approximately 1150° F. (620° C.), depending on the glass thickness and bent to the required shape. The glass is then cooled rapidly with air to temper it and cool it to handling temperatures. The time at which the structure is held above 1150° F. is 2-5 minutes. However, the structure so formed may tolerate temperatures up to about 1450° F. for 5 minutes if necessary to effect the bending and/or tempering process.

EXAMPLE 2

In this example, a 28 inch (0.71 m) by 38 inch (9.97 m), 5/32 inch (4 mm) clear glass substrate with a visible daylight transmittance of 90%, as measured at a wave length of 550 nanometers, is coated with a two-layer thin film coating in a similar fashion as described in Example 1. The coating layers are applied in succession using two of the three zones of the architectural coater available from Airco-Temescal.

All cathode power and process gases are turned off in zone 1. The clear glass is conveyed through the coater at a line speed of 54.5 inches/minute passing through zone 1 unaltered.

At this time, the glass enters zone 2 which is equipped with one Haynes® Alloy No. 214 in position 5 as described in Example 1. The "214" cathode is powered by a 120 kw DC power supply set for 513 volts and 47.0 amps. The "214" cathode is sputtered in an atmosphere with the nominal base pressure of $5.0\times10^{-6}$ Torr for zone 2 increased to a sputtering pressure of $2.0\times10^{-3}$ by bleeding in 652 Sccm of argon gas. A visible light transmittance of 2.9% is recorded on the transmission monitor at the end of zone 2. As described in Example 1, the primary function of the "214" layer is to control transmission, provide thermal performance and resist oxidation at a process temperature of 1450° F. (788° C.) for approximately 5 minutes.

The clear glass is now conveyed to zone 3 which is equipped with one cathode of tin in position 7 as described in Example 1. With the conveyor line speed set at 54.5 inches/minute, a layer of $SNO_X$ is sputtered over the existing Haynes® Alloy No. 214. The tin cathode is powered by a 120 kw DC power supply set for 443 volts and 50 amps. The nominal base pressure of $5.0\times10^{-6}$ Torr for zone 3 is increased to a sputtering pressure of $2.0\times10^{-3}$ Torr by bleeding in 691 Sccm of a premixed 80% oxygen and 20% argon gas. The sputtering pressure is further sublimated with a pure argon flow of 173 Sccm. The two-layer coating passes under a visible light transmission monitor at the end of zone 3 and a reading of 4.0% is recorded. As described in Example 1, the primary function of the $SNO_X$ top layer is to protect the "214" layer from corrosion at the process temperatures mentioned previously, in addition to enhancing color and improving mechanical durability of the completed layer system. The coated glass is inspected for coating defects and the optical properties are evaluated using a colorimeter as manufactured by Spectrogard. In the example, a glass side visible reflectance of 50.62 and glass side chromaticity color coordinates of $\bar{x}=0.3141$, $\bar{y}=0.3249$ are recorded.

At this point, the two-layer coating on clear glass is ready for further processing into an automative sunroof. In such a process, the glass is cut and shaped as in Example 1, but to fit the sunroof configuration. Heating, bending and tempering may take place using conventional techniques, employing temperatures on the order of about 1300° F. for approximately 2-5 minutes as needed with degradation being no more than 10 units of the emissivity, transmission and reflectance characteristics of the sunroof. In addition, the resulting roof exhibits excellent durability and chemical resistance characteristics, as well as a pleasingly aesthetic silver color from the glass side (outside of the automobile) and an almost unnoticeable bronze reflected color to an occupant of the car.

EXAMPLE 3

In this example, a ¼ inch (6 mm) thick clear float glass substrate is coated in a similar fashion as illustrated in Example 2. A slight increase in transmission (approximately a 2% increase) is made by decreasing the current (amps) set point on the Haynes® Alloy No. 214 in zone 2. In changing the current, slight adjustments to the argon bleed may be necessary to maintain a $2.0\times10^{-3}$ Torr sputtering pressure. The parameters illustrated for the $SNO_X$ sputtered in zone 3 may also require slight adjustments to assure final color of the complete 2-layer architectural coating.

The resultant product is an architectural window (spandrel or vision) which, when heated to temperatures normal for bending architectural glass (e.g. about 1120° F. or more, at times of about 10-30 minutes), has similar optical characteristics as other high performance, but not heat treatable, sputtered architectural glasses such as Guardian's SS-8. (e.g. an 8% Ni-based stainless steel coating system overcoated with TiN.)

The advantage to the architectural glass in this example is that it can be bent, tempered or heat strengthened. This glass can also be bent and annealed if desired. In all cases, the architectural glass can be laminated if necessary.

EXAMPLE 4

In this example, a 3 (0.9 mm) by 4 foot (1.22 mm), 5/32 inch (4.8 mm) gray tinted glass substrate with a visible daylight transmittance of 53.0 as measured at a wave length of 550 nanometers, is coated with a four-layer thin film coating in a similar manner as described for the three-layer film coating in Example 1.

The first coating zone is equipped with two tin cathodes (99.9% tin) and installed in positions 1 and 2. The nominal base pressure of $5.0\times10^{-6}$ Torr for zone 1 is increased to a sputtering pressure of $2.0\times10^{-3}$ Torr by bleeding in 893 Sccm of a pre-mixed 80% oxygen and 20% argon gas. The sputtering pressure is further sublimated with a pure Argon flow of 222 Sccm. Both cathodes are powered by 120 KW DC power supplies set for 391 volts, 41 amps and 379 volts, 41 amps, respectively. The glass is conveyed through the coater at a line speed of 62.6 inches/minute. A visible light transmission monitor positioned at the end of Zone 1 recorded a reading of 48.2%. As in Example 1, the resultant coating layer at this point is an antireflective coating of SnOx.

The second coating zone is equipped with one cathode of Haynes® Alloy No. 214 in position 5 and an aluminum cathode (99.5% Aluminum) in position 6. Position 4 is reserved for cathode materials which would enable applying other types of coatings. At the line speed mentioned above, the gray glass passes under the Haynes® Alloy No. 214 and the aluminum where a visible transmission of 4.5% is recorded. The "214" cathode is powered by a 120 KW DC power supply set for 457 volts and 23.5 amps. The aluminum target is powered by a 120 KW DC power supply set at 324 volts and 13 amps. Both cathodes are sputtered in an atmosphere which the nominal base pressure of $5.0 \times 10^{-6}$ Torr for Zone 2 is increased to a sputtering pressure of $2.0 \times 10^{-3}$ Torr by bleeding in 840 Sccm of argon gas. The primary function of the "214" layer is the same as stated in Example 1. The primary function of the aluminum is to retard the oxidation of the "214" layer during heat treatment, therefore, increasing the heat stability of the total layer system. Abrasion and scratch resistance is enhanced as well.

The third coating zone is equipped with one tin cathode in position 7 and one tin target in position 8. Position 9 is reserved for cathode materials which would enable applying other types of coatings. Continuing at the pre-set line speed of 62.6 inches/minute, a second layer of SnOx is sputter-coated over the existing 3-layer coating. As in Zone 1, a 120 KW DC power supply is used to power the tin cathodes. The power supplies are set at 582 volts, 35 amps and 372 volts, 40 amps, respectively. The nominal base pressure of $5.0 \times 10^{-6}$ Torr for Zone 3 is increased to a sputtering pressure of $2.0 \times 10^{-3}$ Torr by bleeding in 849 Sccm of pre-mixed 80% oxygen and 20% Argon gas. The sputtering pressure is further sublimated with a pure Argon flow of 212 Sccm. The four-layer coating passes under a visible light transmission monitor at the end of Zone 3 and a reading of 7.2% is recorded. The primary function of the fourth layer (SnOx) is the same as stated for the third layer (SnOx) in Example 1. The coated glass is inspected for coating defects and the optical properties are evaluated using a colorimeter as manufactured by Spectrograd. In this example, a glass side visible reflectance of 15.51 and glass side chromaticity color coordinates of $\bar{x}=0.3176$, $\bar{y}=0.3234$ are recorded. The thicknesses of the four layers are approximately:

| Layer | Angstroms |
|-------|-----------|
| A | 160Å |
| B | 150Å |
| C | 60Å |
| D | 160Å |

At this point, the four-layer coating on 5/32 gray tinted glass is ready for further processing into an automotive side lite (privacy window) in a similar manner as set forth in Example 1.

Once given the above disclosure, many other features, modifications or improvements will become apparent to the skilled artisan. Such other features, modifications and improvements are, therefore, considered to be a part of this invention, the scope of which is to be determined by the following claims:

We claim:

1. In a method of forming a heat treated glass article useful as an automotive or architectural window, the improvement comprising:
    coating on the surface of said glass article prior to heat treatment a coating system capable of withstanding temperatures of from about 1150° F.-1450° F. for from about 2-30 minutes without significant degradation of color, durability, chemical resistance, emissivity, reflectance and transmittance as these characteristics are defined in terms of an automotive or architectural window, said coating system consisting of a metallic oxide overcoat layer consisting essentially of stoichiometric tin oxide, and an intermediate metallic layer consisting essentially of nickel or a Ni-Cr-Fe alloy having about 70-90% by weight nickel; and thereafter,
    subjecting said coated glass article to a heat treatment selected from bending, heat strengthening, tempering or combinations thereof at about 1150° F.-1450° F. for from about 2-30 minutes without significant degradation of color, durability, chemical resistance, emissivity, reflectance and transmittance as these characteristics are defined in terms of an automotive or architectural window.

2. In the method of claim 1 wherein said coating step is conducted by sputter-coating said layers sequentially onto said glass article.

3. In the method of claim 2 the improvement wherein the metallic layer consists essentially of, by weight: about 76% Ni, about 4% Fe, about 16% Cr, less than about 0.5% C, about 5% Al, and about 0.01% Y.

4. In the method of claim 3 the improvement wherein the metallic layer consists essentially of, by weight:

| Element | % |
|---------|---|
| Ni | about 75.45 |
| Fe | about 4.00 |
| Cr | about 16.00 |
| C | about .04 |
| Al | about 4.50 |
| Y | about 0.01 |

5. In a method of forming a heat treated glass article useful as an automotive or architectural window, the improvement comprising:
    coating on the surface of said glass article prior to heat treatment a coating system capable of withstanding temperatures of from about 1150° F.-1450° F. for from about 2-30 minutes without significant degradation of color, durability, chemical resistance, emissivity, reflectance and transmittance as these characteristics are defined in terms of an automotive or aarchitectural window, said coating system consisting of a metallic oxide undercoat layer consisting essentially of stoichiometric tin oxide, a metallic overcoat layer consisting essentially of stoichiometric tin oxide, and an intermediate metallic layer consisting essentially of nickel or a Ni-Cr-Fe alloy having about 70-90% by weight nickel; and thereafter,
    subjecting said coated glass article to a heat treatment selected from bending, heat strengthening, tempering or combinations thereof at about 1150° F.-1450° F. for from about 2-30 minutes without significant degradation of color, durability, chemical resistance, emissivity, reflectance and transmittance as these characteristics are defined in terms of an automotive or architectural window.

6. In the method of claim 5 wherein said coating step is conducted by sputter-coating said layers sequentially onto said glass article.

7. In the method of claim 6 the improvement wherein the metallic layer consists essentially of, by weight: about 76% Ni, about 4% Fe, about 16% Cr, less than about 0.5% C, about 5% Al, and about 0.01% Y.

8. In the method of claim 7 the improvement wherein the metallic layer consists essentially of, by weight:

| Element | % |
|---------|---|
| Ni | about 75.45 |
| Fe | about 4.00 |
| Cr | about 16.00 |
| C | about .04 |
| Al | about 4.50 |
| Y | about 0.01 |

* * * * *

UNITED STATES PATENT AND TRADEMARK OFFICE
CERTIFICATE OF CORRECTION

PATENT NO. : 5,242,560
DATED : September 7, 1993
INVENTOR(S) : Lingle et al

It is certified that error appears in the above-indentified patent and that said Letters Patent is hereby corrected as shown below:

On the title page, item [60] Related U.S. Application Data, line 3, cancel "Pat. No. 5,048,799" and insert therefore --now abandoned--.

Signed and Sealed this

Fourteenth Day of February, 1995

Attest:

BRUCE LEHMAN

Attesting Officer     Commissioner of Patents and Trademarks